United States Patent [19]
Fujita

[11] Patent Number: 4,630,183
[45] Date of Patent: Dec. 16, 1986

[54] LIGHT EMITTING DIODE LAMP AND METHOD FOR PRODUCING THEREOF

[75] Inventor: Teizo Fujita, Ibaraki, Japan

[73] Assignee: Izumi Denki Corporation, Osaka, Japan

[21] Appl. No.: 435,591

[22] Filed: Oct. 20, 1982

[30] Foreign Application Priority Data

Oct. 23, 1981 [JP] Japan .............................. 56-170403

[51] Int. Cl.⁴ ............................................. F21V 3/00
[52] U.S. Cl. .................................... 362/311; 362/226; 362/800; 313/318; 313/512; 445/27
[58] Field of Search ................. 362/95, 226, 254, 311, 362/800; 340/815.03; 29/854, 855, 856, 884; 350/96.17, 96.2; 313/499, 500, 512; 339/157 R; 357/74; 445/23, 24, 27, 28

[56] References Cited

U.S. PATENT DOCUMENTS

| | | | |
|---|---|---|---|
| 3,609,475 | 9/1971 | Kaposhilin | 313/512 |
| 3,785,020 | 1/1974 | Bosos | 445/27 |
| 3,976,877 | 8/1976 | Thillays | 313/512 |
| 3,986,068 | 10/1976 | Albrecht | 313/318 |
| 4,050,763 | 9/1977 | Smithgall | 313/318 |
| 4,054,814 | 10/1977 | Fegley et al. | 313/512 |
| 4,211,955 | 7/1980 | Ray | 362/800 |
| 4,358,708 | 11/1982 | Silva et al. | 313/318 |

Primary Examiner—Parshotam S. Lall
Attorney, Agent, or Firm—Pollock, Vande Sande & Priddy

[57] ABSTRACT

Disclosed is a light emitting diode lamp and a method for producing thereof, in which at least one light emitting diode is connected between at least a pair of conductive members at their upper end portions, the light emitting diode is embedded together with the conductive members in a molding of a light transmissible resin material, with the respective lower end portions of the conductive members being left exposed, and the respective exposed lower end portions of the conductive members are connected to a lamp base or cap and a contact member supported at the lower end of the lamp base or cap and insulated from the lamp base or cap.

13 Claims, 9 Drawing Figures

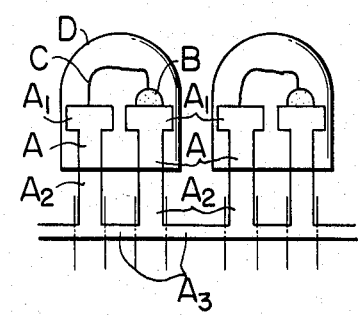
FIG. 1
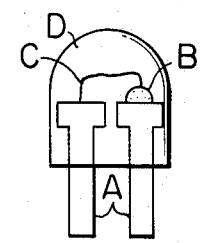
FIG. 2
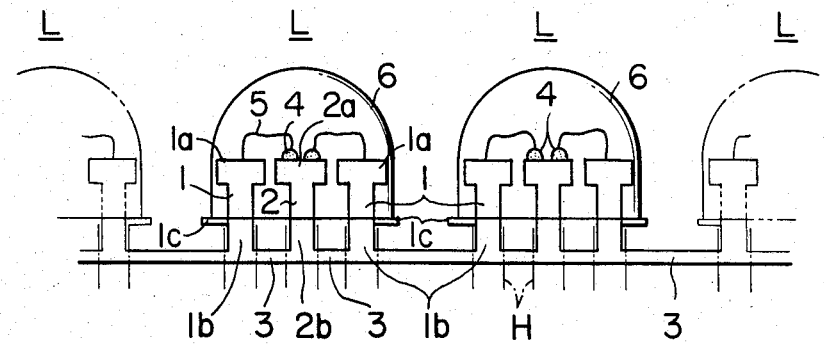
FIG. 3
FIG. 4
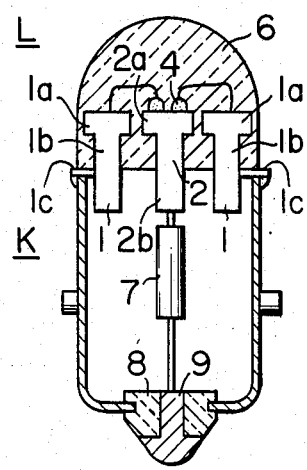

LIGHT EMITTING DIODE LAMP AND METHOD FOR PRODUCING THEREOF

The present invention relates to an illumination light source device using a light emitting diode (LED) (hereinafter referred to as LED-lamp) and a method for producing thereof.

When comparison is made between an LED-lamp and a small-sized incandescent lamp as an illumination source, it is known well that the former is superior to the latter in life, reliability, consumed power, resulting in increased application of LED-lamps as a pilot lamp in various electronic apparatus and machines. In fact, however, small-sized incandescent lamps are still used as pilot lamps in such apparatus as automatic vending machines. There may occur in such machines an unavoidable burn-out of an incandescent lamp. It is very troublesome to replace the burnt-out lamp by a new one every time such a failure occurs, and if the burnt-out lamp is not replaced, inconvenience and displeasure are given to users, resulting in distrust for the apparatus. A conventional small-sized incandescent lamp has a lamp cap or base with thread (Edision type) or with protrusions (swan type) which may be received in a socket of the Edison type or the swan type respectively. An LED is not provided with such a base or cap and therefore it is very troublesome to mount in an apparatus as an LED-lamp or substitute for a conventional small-sized incandescent lamp.

To eliminate the above-mentioned drawback, an object of the present invention is to provide an LED-lamp provided with a base or cap of the same standardized dimension as that of a conventional small-sized incandescent lamp.

Another object of the present invention is to provide a method for producing an LED-lamp provided with such a base or cap as mentioned above.

According to the present invention, a light emission diode lamp and a method for producing thereof are provided in which at least one light emitting diode is connected between at least a pair of conductive members at their upper end portions. The light emission diode is embedded together with the conductive members in a molding of a light-transmissible resin material, with the respective lower end portions of the conductive members being left exposed. The respective exposed lower end portions of the conductive members are connected to a lamp base or cap and a contact member supported at the lower end of the lamps base or cap and insulated from the lamp base or cap.

Other objects, features and functions of the invention will be apparent from the descriptions which will be made hereunder in conjunction with the attached drawings.

DESCRIPTION OF THE FIGURES

FIG. 1 is a front view for explaining the process of producing conventional LED;

FIG. 2 is a front view of a conventional LED;

FIG. 3 is a front view for explaining the process of producing LED-lamps according to a first embodiment of the present invention;

FIG. 4 is a cross-sectional elevation view of the LED-lamp of the first embodiment of the present invention of FIG. 3;

DESCRIPTION OF THE PREFERRED EMBODIMENT

To facilitate the understanding of the present invention, brief description will be made about the construction of a conventional LED and a method for producing thereof by referring to FIGS. 1 and 2. FIGS. 1 and 2 show an example of conventional LED. In this conventional case, the LEDs are produced in such a manner that a plurality of sets of conductors connected in the form of train is punched out successively from an electrically conductive sheet by using a drill-press. Each set includes a pair of T-shaped conductors A, A each having a lead stripped portion $A_2$ and a substrate portion $A_1$ (hereinafter each conductor being referred to as a lead-substrate). Then, an LED element B is electrically attached onto the substrate portion $A_1$ of one of the pair of lead-substrate A, A successively in each of the series connected conductor sets, and electrically connected to the other substrate portion $A_1$ by a lead wire C. Then, the LED element B is embedded in a molding of a light-transmissible resin material D together with the substrate portions $A_2$, $A_2$, the lead wire C and parts of the lead strip portions $A_2$, $A_2$ in every set successively. Finally, connection portions $A_3$ connecting adjacent ones of lead strip portions $A_2$, $A_2$ are cut off to obtain an individual LED as shown in FIG. 2.

Such a conventional LED-lamp as shown in FIG. 2 has no lamp cap or base and therefore it can not be received by a socket which is mounted an apparatus. Thus, it is very troublesome to attach or mount such an LED-lamp in an apparatus. Further, since the operating voltage of an LED is low when it is separately used, it may be necessary to connect a resistor in series with the LED-lamp, resulting in much trouble in rewiring.

Preferred embodiments of the present invention will be described hereunder by referring to FIGS. 3–9 of the drawings attached herewith.

Figure 5:
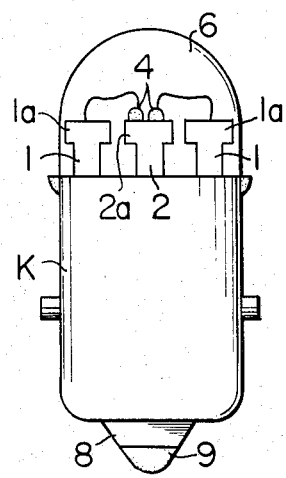
FIG. 5 is a front view of the LED-lamp of FIG. 4.

FIGS. 3 to 5 illustrate a first embodiment of the present invention. An LED-lamp unit L comprises three aligned and parallel extending lead-substrates, a central one of which is represented by numeral 2 and each of the outer two by numeral 1. Similarly to the above-mentioned example case of conventional LED-lamps lamps, the LED lamps unit L of this embodiment of the present invention is produced in such a manner that a plurality sets of lead-substrates connected through connection portions 3 in the form of a train is first punched out successively from a conductive sheet by using a drill-press, each set including the above-mentioned three lead-substrates 1, 2, 1, as shown in FIG. 3. Similarly to those of the above-mentioned conventional LED-lamp, the lead-substrates 1, 2, 1 include upper wide-substrate portions 1a, 2a, 1a and lower narrow-strip portions 1c, 2b, 1c respectively. However, these lead-substrates 1a, 2a, 1a are different to those of the conventional LED-lamp in that each of the outer lead-substrates 1a, 1a is formed at its longitudinally intermediate portion with an outward protrusion 1c. Then, two LED-elements 4, 4 are electrically attached onto the substrate portion 2a and connected to the respective substrates 1a, 1a by lead wires 5, 5 with the lower ends of the lead strip portions 1b, 2b, 1b connected to each other by the connection portions 3, in every set, as shown in FIG. 3. Then, the LED elements 4 are embedded in a molding of a light-transmissible resin material 6 together with the substrate portions 1a, 2a, 1a, the lead wires 5, 5 and the upper parts of the lead strip portions 1b, 2b, 1b, with the protrusions 1c, 1c and the lower parts of the lead strip portions left exposed, in every set. Then, the connection portions 3 are cut off at broken lines H in FIG. 3 to produce individual LED-lamp units L. According to the embodiment of the present invention, finally, a commercially available or previously prepared lamp cap or base K of the swan type as shown in FIG. 4 or of the Edison type (FIG. 9), or any other type, is attached to the LED-lamp unit L in such a manner that the lead strip portion 2b of the central lead-substrate 2 of the LED-lamp unit L is connected through a resistor 7 to an electrical contact member 9 which is supported by an electrical insulating material 8 in the lower opening of the lamp cap or base K. The lower portion of the LED-lamp unit L is fit into the upper opening of the lamp cap or base K with the protrusions 1c, 1c being electrically connected by soldering to the upper end portions of the lamp cap or base, so that the LED-lamp according to the embodiment of the present invention is completed. The thus produced LED-lamp according to the embodiment is not different in its external form from that of the conventional small-sized incandescent lamp and is interchangeable therewith.

Figure 6:
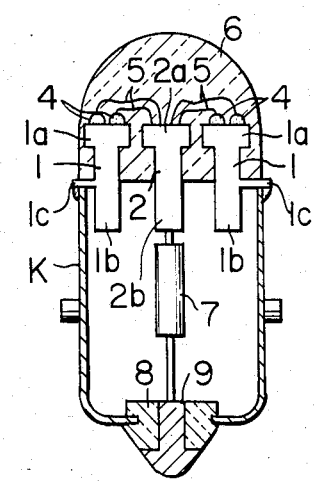
FIG. 6 is a cross-sectional elevational view of the LED-lamp according to a second embodiment of the present invention.

FIG. 6 shows an LED-lamp according to a second embodiment of the present invention, which is similar to that shown in FIGS. 4 and 5 but different in that two LED elements are attached on the substrate portion 1b of each of two outer lead-substrates 1, 1 and connected to the substrate portion 2a of the central lead-substrate 2 through lead wires 4, so that the four LED-elements 4 may be parallel excited.

Figure 7:
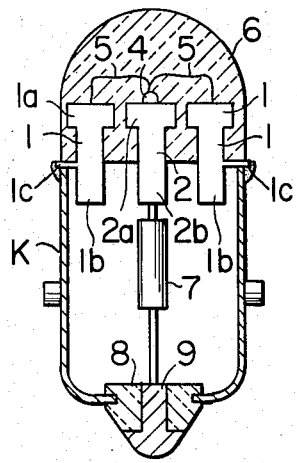
FIG. 7 is a cross-sectional elevation view of the LED-lamp according to a third embodiment of the present invention.

FIG. 7 shows an LED-lamp according to a third embodiment of the present invention, which is similar to that shown in FIGS. 3 and 4 but different therefrom in that only one LED-element 4 is attached on the substrate portion 2a and connected through lead wires 5, 5 to the respective substrate portions 1a, 1a.

Figure 8:
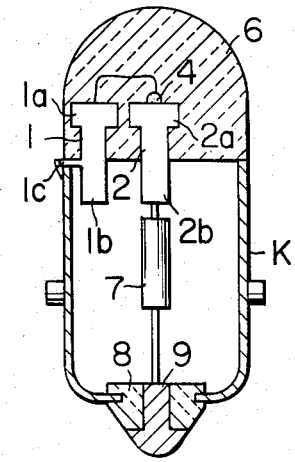
FIG. 8 is a cross-sectional elevation view of the LED-lamp according to a fourth embodiment of the present invention.

FIG. 8 shows an LED-lamp according to a fourth embodiment of the present invention, which is similar to that shown in FIG. 7 but different therefrom in that one of the outer lead-substrates 1, 1 and one of the lead wires 5, 5 connected thereto are omitted.

Figure 9:
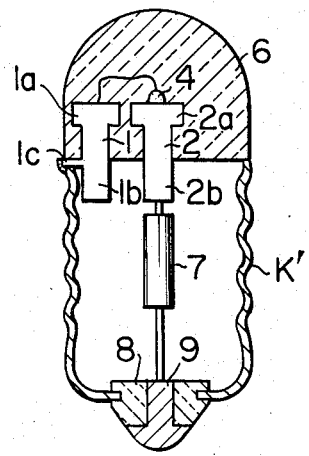
FIG. 9 is a cross-sectional elevation view of the LED-lamp according to a fifth embodiment of the present invention.

FIG. 9 shows an LED-lamp according to a fifth embodiment of the present invention, which is similar to that shown in FIG. 8 but different therefrom in that a lamp cap or base K' with thread or of the Edison type is substituted for that of the swan type. Of course, such a lamp cap or base of the Edison type may be substituted for that of the swan type not only in the fourth embodiment but any one of the first to third embodiments.

A diode or a capacitor is added to or substituted for the resistor 7, if necessary, in any one of the above-mentioned embodiments.

Thus, the LED-lamp according to the present invention has a commercially available or standardized lamp cap or base and therefore has interchangeability with the conventional incandescent lamp having a lamp cap or base of the same type, so that it has advantages in that it may be easily and conveniently used when compared with the conventional one and it may widen the practical utilization thereof.

It will be appreciated that the present invention is not restricted to the embodiments as mentioned above but various modifications thereof may be made without departing from the scope of the claimed invention.

What is claimed:

1. A light emitting diode lamp comprising:
  (A) a light emitting diode assembly unit including,
    (a) at least three spaced apart conductive means, one of said conductive means being central to the remaining two conductive means, and two remaining conducive means having radially extending portions at their lower end portions;
    (b) at least one light emitting diode element electrically connected between one of the outer of said conductive means and the central of said conductive means at their upper end portions;
    (c) a molding of a light-transmissible material which embeds said light emitting diode element and the upper portions of said conductive means, leaving lower end portions of said conductive means exposed;
  (B) a lamp cap or base assembly unit including,
    (d) a substantially cylindrical cap or base member having openings at its axially opposite end portions, said light emitting diode assembly unit being attached to said cap or base unit so as to seal one of the opposite openings of said cap or base member with the exposed lower end portion of said remaining two conductive means, said remaining two conductive means electrically connected at said radially extending portions to the rim of said remaining opening of said cap or base member; and
    (e) an electrical contact means supported by an electrical insulating member which seals the other opening of said cap or base member and insulates said contact means from said cap or base member, the exposed lower end portion of the central conductive means being electrically connected to said contact means.

2. A light emitting diode lamp according to claim 1, wherein said cap or base member is of the swan type.

3. A light emitting diode lamp according to claim 2, wherein the exposed lower end portion of said central conductive means is connected to said contact means through a resistor means.

4. A light emitting diode lamp according to claim 1, wherein said cap or base member is of the Edison type.

5. A light emitting diode lamp according to claim 4, wherein the exposed lower end portion of said central conductive means is connected to said contact means through a resistor means.

6. A method of producing a light emitting diode lamp comprising the steps:
  electrically connecting at least one light emitting diode element between a central conductive means and at least one of two outer conductive means at their respective upper end portions, said two outer conductive means having at the lower end portions thereof a radially extending portion;
  preparing a light emitting diode assembly unit by embedding said at least one light emitting diode element together with said upper end portions of said central conductive means and said two conductive means in a molding of a light transmissible resin material leaving lower end portions of said conductive means left exposed;

preparing a lamp cap or base assembly unit including a substantially cylindrical lamp cap or base member having openings at its axially opposite ends, one opening being sealed by an electrical insulator material which supports an electrical contact means and insulates said contact means from said cap or base member; and electrically connecting the radially extending portions of said two lower conductive means end portions to the rim of said remaining opening of said cap or base member and said central conductive means to said contact means, respectively, with the other opening of said cap or base member being sealed by said light emitting diode assembly unit.

7. The method according to claim 6, in which the exposed lower portion of said central conductive means is connected through a resistor to said contact means.

8. The method according to claim 6, wherein the exposed lower end portion of said central conductive means is connected to said contact means through a resistor means.

9. A method of producing a light emitting diode lamp comprising the steps of:

electrically connecting at least two light emitting diode elements between a central one and one of the outer two of three conductive means which are aligned and extending parallel to each other, and between said central conductive means and the other outer conductive means, respectively, at their upper end portions the outer two of said conductive means having at a lower end thereof radially extending portions;

preparing a light emitting diode assembly unit by embedding said at least two light emitting diode elements together with said upper end portions of said three conductive means in a molding of a light transmissible resin material, with lower end portions of said three conductive means left exposed;

preparing a lamp cap or base assembly unit including a substantially cylindrical lamp cap or base member having openings at its axially opposite ends, one opening being sealed by an electrical insulating material which supports an electrical contact means and insulates said contact means from said cap or base member; and electrically connecting the respective exposed lower radially extending end portions of said outer two conductive means to the top rim of said remaining opening of said cap or base member and the exposed lower end portion of said central conductive means to said contact means, with the other opening of said cap or base member being sealed by said light emitting diode assembly unit.

10. The method according to claim 9, wherein the exposed free end portion of said central conductive means is connected to said contact means through a resistor means.

11. A method of successively producing a plurality of light emitting diode lamps comprising the steps of:

preparing a train of serially connected plural sets of conductive means each extending perpendicularly from a linearly extending conductive connection means, each set including at least three parallel conductive means, the outer two of said conductive means having at a lower end thereof radially extending portions, by punching out from an electrically conductive sheet;

electrically connecting at least one light emitting diode element between respective free end portions of a central of said parallel conductive means and one of the remaining conductive means of each of said plural sets;

embedding said at least one light emitting diode element together with the respective free end portions of said at least three conductive means of each of said plural sets in a molding of a light-transmissible resin material, with lower end portions of said two conductive means and said connection means being left exposed;

cutting off connecting portions of said connection means between respective adjacent sets of conductive means to prepare a plurality of individual light emitting diode assembly units each including said at least one light emitting diode element and said at least two conductive means with their free lower ends exposed;

preparing a plurality of lamp cap or base assembly units of the same number as said plurality of light emitting diode assembly units, each of said lamp cap or base assembly units including a substantially cylindrical lamp case or base member having openings at its axially opposite ends, one opening being sealed by an electrical insulating material which supports an electrical contact means and insulates said contact means from said cap or base member; and electrically connecting the exposed free end portions of said two outer conductive means radially extending portions of each of said light emitting diode assembly units to the rim of said remaining opening of said cap or base member and the remaining central conductive means to said contact means of corresponding one of said cap or base assembly units, with the other opening of said cap or base member being sealed by said light emitting diode assembly unit.

12. The method according to claim 11, wherein the exposed free end of the central one of said three conductive means is connected to said conductive means through a resistor means.

13. A method of successively producing a plurality of light emitting diode lamps comprising the steps of:

preparing a train of serially connected plural sets of conductive means, each extending perpendicularly from a linearly extending conductive connection means, each set including three aligned conductive means, the outer two of said conductive means having at the lower ends radially extending portions, by punching out from an electrically conductive sheet;

electrically connecting at least two light emitting diodes between a central conductive means and one of two outer conductive means, and between the central conductive means the other conductive means, respectively, at their respective free end portions, of each of said plural sets;

embedding said at least two light emitting diode elements together with the respective free end portions of said three conductive means of each of said plural sets in a molding of a light transmissible resin material, with lower end portions of said three conductive means and said connection means being left exposed;

cutting off connecting portions of said connection means between respective adjacent two conductive means to prepare a plurality of individual light emitting diode assembly units each including said at least two light emitting diode elements and said three conductive means with their free lower ends exposed;

preparing a plurality of lamp cap or base assembly units in the same number as said plurality of light emitting diode assembly units, each of said lamp cap or base assembly units including a substantially cylindrical lamp case or base member having openings at its axially opposite ends, one opening being sealed by an electrical insulator material which supports an electrical contact means and insulates said contact means from said cap or base member; and electrically connecting the respective exposed radially extending portions of said outer two of said three conductive means to the rim of the remaining opening of said cap or base member, and the exposed free end portion of central one of said three conductive means to said contact means, of corresponding one of said cap or base assembly, with the other opening of said cap or base member being sealed by said light emitting diode assembly unit.

* * * * *